United States Patent
Bae

(10) Patent No.: US 7,550,920 B2
(45) Date of Patent: Jun. 23, 2009

(54) ORGANIC ELECTROLUMINESCENT DEVICE AND METHOD FOR MANUFACTURING THE SAME

(75) Inventor: Hyo Dae Bae, Daegu (KR)

(73) Assignee: LG Electronics Inc., Seoul (KR)

( * ) Notice: Subject to any disclaimer, the term of this patent is extended or adjusted under 35 U.S.C. 154(b) by 482 days.

(21) Appl. No.: 11/313,998

(22) Filed: Dec. 22, 2005

(65) Prior Publication Data

US 2006/0138949 A1  Jun. 29, 2006

(30) Foreign Application Priority Data

Dec. 24, 2004  (KR) ............... 10-2004-0112144

(51) Int. Cl.
*H01J 1/62* (2006.01)

(52) U.S. Cl. ................. 313/506; 313/504

(58) Field of Classification Search .......... 313/498, 313/503, 504, 506; 315/169.1, 169.3
See application file for complete search history.

(56) References Cited

U.S. PATENT DOCUMENTS 7,221,091 B2 * 5/2007 Park ....................... 313/505
7,224,334 B2 * 5/2007 Choi et al. ................ 345/82

* cited by examiner

*Primary Examiner*—Vip Patel
(74) *Attorney, Agent, or Firm*—Birch, Stewart, Kolasch & Birch, LLP

(57) ABSTRACT

An organic electroluminescent device achieves high resolution by decreasing space between the anode electrodes. The organic electroluminescent device is manufactured by a method wherein cathode electrode layers are disposed to intersect with anode electrode layers; organic layers are formed in each intersecting part where one cathode electrode layer and two anode electrode layers intersect; and a multi-layered wiring part supplies driving signals to a first anode electrode layer of a first intersecting part and a second anode electrode layer of a second intersecting part, adjacent to the first anode electrode layer.

16 Claims, 4 Drawing Sheets

ORGANIC ELECTROLUMINESCENT DEVICE AND METHOD FOR MANUFACTURING THE SAME

BACKGROUND OF THE INVENTION

1. Field of the Invention

The present invention relates to an organic electroluminescent device of the active matrix (AM) and passive matrix (PM) types, and a method for manufacturing the same. Particularly, the present invention relates to an organic electroluminescent device and a method for manufacturing the same, capable of achieving high resolution and big size by decreasing a space between the anode electrodes.

2. Description of the Related Art

Organic electroluminescence is a phenomenon wherein excitons are formed in an organic (low molecular or high molecular) material thin film by recombining holes injected through an anode with electrons injected through a cathode, and a light of specific wavelength is generated by energy from thus formed excitons. The basic structure of an organic electroluminescent device using the phenomenon and a method for manufacturing the same will be described hereinafter.

FIG. 1 is a plan view of an organic electroluminescent device, in accordance with the related art. FIG. 2 is a cross-sectional view of the organic electroluminescent device of FIG. 1, as taken along line A-A.

The basic structure of an organic electroluminescent device includes a glass substrate 1, an anode electrode layer 2 formed on the upper side of the glass substrate 1, an organic material layer 3 (hereinafter, referred to as "organic EL layer") formed on the anode electrode layer 2, and a cathode electrode layer 4 formed on the organic EL layer 3.

The organic EL layer 3 has a structure wherein a hole transport layer, a light emitting layer and an electron transport layer are stacked in order. Each cathode electrode layer 4 maintains a certain space from adjacent cathode electrode layers 4. The anode electrode layer 2 acts as an anode electrode, and the cathode electrode layer 4 acts as a cathode electrode.

A wall 5 separates two adjacent cathode electrode layers 4. The wall 5 is formed in an area between two adjacent cathode electrode layers 4. The wall 5 is separated from the anode electrode layer 2 by an insulating layer 4a. Although organic material and cathode electrode material are deposited on the upper side or top of each wall 5 during the processes of forming the organic EL layer 3 and cathode electrode layer 4, neither functions as a component of the device.

The organic electroluminescent device having the above structure is manufactured by the following processes.

First, a plurality of anode electrode layers 2 are deposited on a glass substrate 1, and then an insulating layer 4a is formed on the entire surface area of the substrate 1 except predetermined areas (luminescent areas).

Then, a plurality of walls 5 crossing the anode electrode layers 2 are formed thereon, followed by forming organic EL layers 3 and cathode electrode layers 4 on the entire structure including the walls 5.

In the organic electroluminescent device of the related art, illustrated in FIG. 1, predetermined spaces exist between anode electrode layers 2. In a high resolution display device, in which the number of luminescent areas per unit area is increased, these spaces between the anode electrode layers 2 become a major concern. Since the spacing between anode layers 2 is predetermined, a large number of luminescent areas requires an increase in the size of the display device to accommodate the many required spaces between the anode electrodes layers 2, which is counter to the higher resolution goal, i.e. more luminescent areas per unit area.

SUMMARY OF THE INVENTION

An object of the present invention is to address one or more of the drawbacks associated with the related art.

It is an object of the present invention to provide an organic electroluminescent device having a structure which can increase the number of luminescent areas per unit area, without increasing a size of the panel, to resolve the above problem of the related art display.

The organic electroluminescent device according to the present invention comprises anode electrode layers; cathode electrode layers disposed to intersect (e.g. overlie or underlie) with the anode electrode layers; organic layers formed in each intersecting part where one cathode electrode layer and two anode electrode layers intersect; and a multi-layered wiring part for supplying driving signals to each of a first anode electrode layer of a first intersecting part and a second anode electrode layer of a second intersecting part adjacent to the first anode electrode layer.

Preferably, the wiring part comprises a first data line connected to the first anode electrode layer; a first metal line formed on the first data line; an insulating layer formed on the first metal line and a part of the second anode electrode layer; a second data line formed on the insulating layer and connected to the second anode electrode layer; and a second metal line formed on the second data line.

A manufacturing method of the organic electroluminescent device according to the present invention comprises the steps of forming anode electrode layers on a substrate in parallel; forming organic layers on the anode electrode layers; forming cathode electrode layers on the organic layers, wherein each of the cathode electrode layers intersects with two anode electrode layers in an intersecting part; and forming multi-layered wiring parts for supplying driving current independently to a first anode electrode layer of a first intersecting part and a second anode electrode layer of a second intersecting part adjacent to the first anode electrode layer.

The step of forming the wiring parts comprises the steps of forming a first metal line on a first data line connected to the first anode electrode layer; forming an insulating layer on the first metal line, a part of the second anode electrode layer, and the substrate between the two anode electrode layers; forming a second data line connected to the second anode electrode layer on the insulating layer; and forming a second metal line on the second data line.

The organic electroluminescent device according to the present invention forms stacked metal lines which can supply driving current (data current) independently to each of two anode electrode layers in a space between two columns of anode electrode layer. Thus, the space between two anode electrode layers can be minimized, and the size of the device can be remarkably minimized.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will be more clearly understood from the detailed description in conjunction with the following drawings.

DETAILED DESCRIPTION OF THE INVENTION

Hereinafter, a preferred embodiment of the organic electroluminescent device according to the present invention will be explained in more detail with reference to the accompanying drawings.

Figure 1:
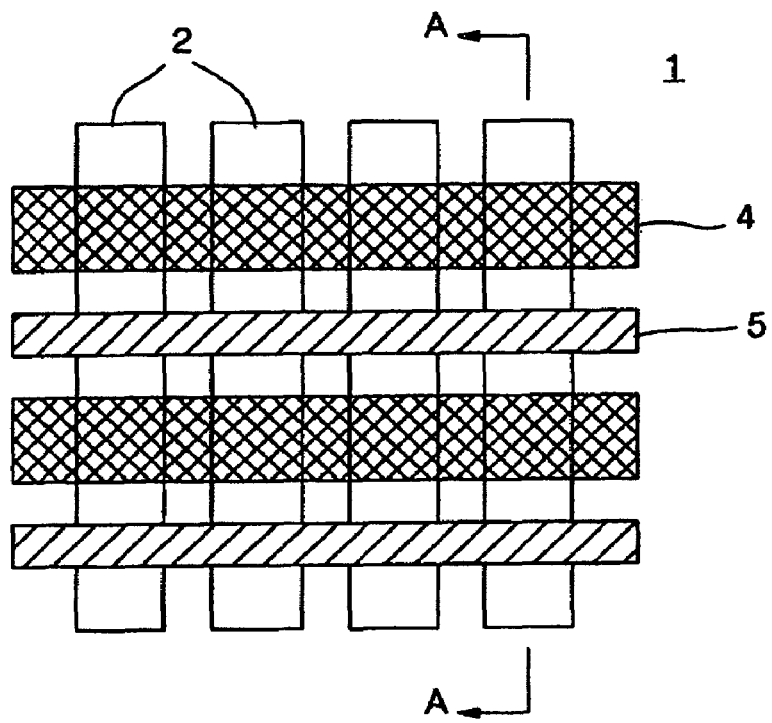
FIG. 1 is a plan view of an organic electroluminescent device, in accordance with the related art.
Figure 2:
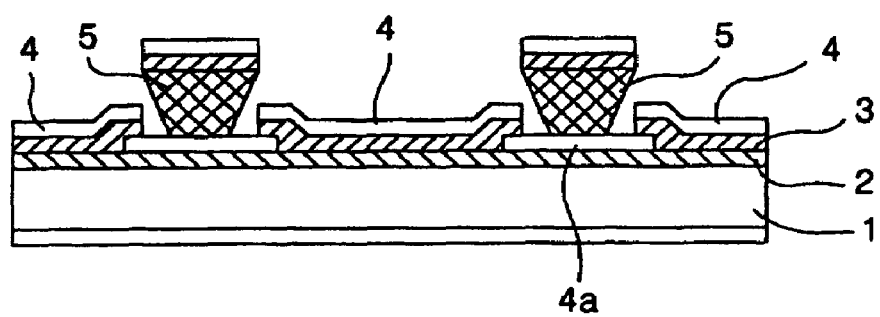
FIG. 2 is a cross-sectional view of the organic electroluminescent device of FIG. 1, as taken along line A-A.
Figure 3:
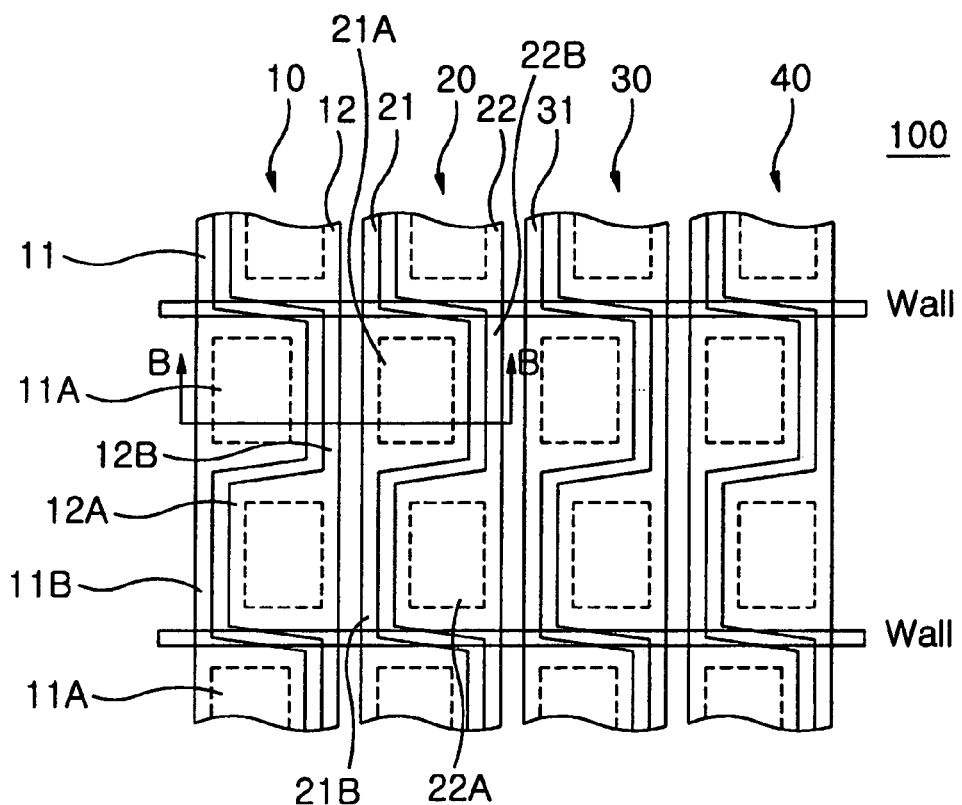
FIG. 3 is a plan view illustrating a part of the organic electroluminescent device according to the present invention.

FIG. 3 is a plan view illustrating a part of the organic electroluminescent device, according to the present invention. For convenience sake, only a part of four columns of anode electrode layer 10, 20, 30 and 40, formed on the substrate 100, are illustrated. An Indium Tin Oxide (ITO) layer is preferred for the anode electrode layer, and is exemplified below.

As described above, each column of ITO layer 10, 20, 30 and 40 includes two ITO layers 11, 12 and 21, 22. For convenience's sake, reference numerals are given to only ITO layers included in two columns of ITO layer 10 and 20. Each ITO layer 11, 12 and 21, 22 includes luminescent areas 11A, 12A, 21A and 22A with predetermined areas spaced from each other and connecting areas 11B, 12B, 21B and 22B connecting the luminescent areas 11A, 12A, 21A and 22A with a predetermined width.

Two ITO layers 11 and 12 included in the column of ITO layer 10 are formed apart by a predetermined width. Each luminescent area 11A of ITO layer 11 corresponds spatially to each connecting area 12B of ITO layer 12. Therefore, the column of ITO layer 10 has almost the same width as the width of ITO layer 11 or ITO layer 12.

The metal line of each ITO layer 21 or 22 included in the column of ITO layer 20 is formed in a stack in the same area as the metal line of each corresponding ITO layer 12 or 31 included in an adjacent column of ITO layer 10 or ITO layer 30, respectively.

Hereinafter, a preferred embodiment of the manufacturing method of the organic electroluminescent device according to an embodiment of the present invention will be explained in more detail with reference to FIG. 3 and FIGS. 4a-4f.

In FIG. 3, for convenience sake, only four columns of ITO layer 10, 20, 30 and 40 formed on the substrate 100 are illustrated spaced from each other. Through the steps illustrated in FIG. 4a to FIG. 4f, a wiring part is formed between two columns of ITO layer. Then, organic layers and cathode electrode layers are formed in sequence. A metal layer is preferred for the cathode electrode layer, and is exemplified so below.

FIGS. 4a-4f are sectional views along the line B-B of FIG. 3, illustrating the step-by-step manufacturing method of the organic electroluminescent device according to an embodiment of the present invention. In FIGS. 4a-4f, for convenience sake, the ITO layers 12 and 21 corresponding to each other included in two adjacent columns of ITO layer 10 and 20 are exemplified.

Figure 4A:
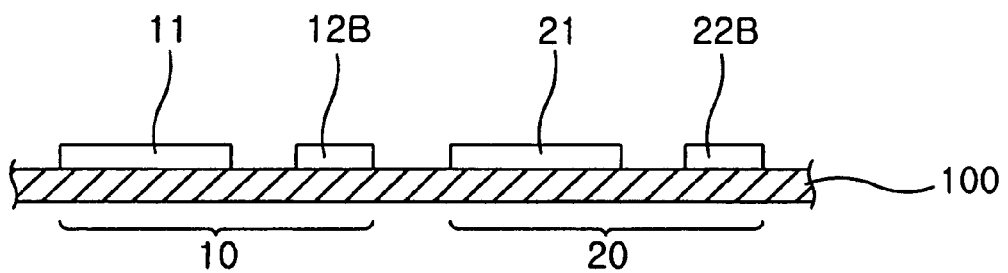
FIGS. 4a-4f are sectional views along the line B-B, illustrating a step-by-step manufacturing method of the organic electroluminescent device according to the present invention.

As explained above, the columns of ITO layer 10 and 20 are formed on the substrate 100 (see FIG. 3 and FIG. 4a).

Then, a first metal line M12 of a first ITO layer 12 included in a first column of ITO layer 10 and a second metal line M21 of a second ITO layer 21 included in a second column of ITO layer 20 are formed in the same area, which is defined as "a wiring part."

Figure 4B:
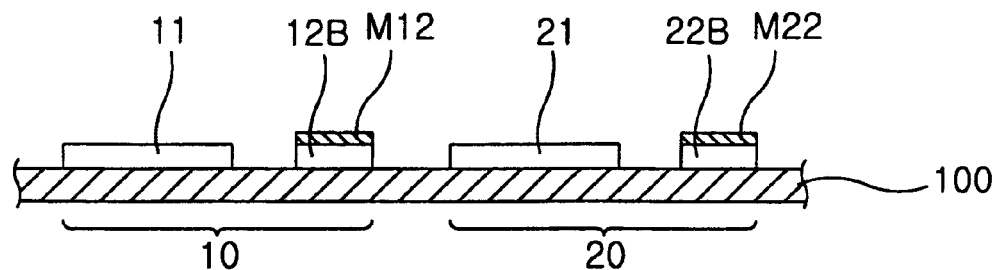

First, the first metal line M12 is formed along a first data line 12B connected to the first ITO layer 12 on the first data line 12B (FIG. 4b). Molybdenum is a preferred material for the first metal line M12. It is preferable to make the width of the first metal line M12 the same as that of the first data line 12B.

Figure 4C:
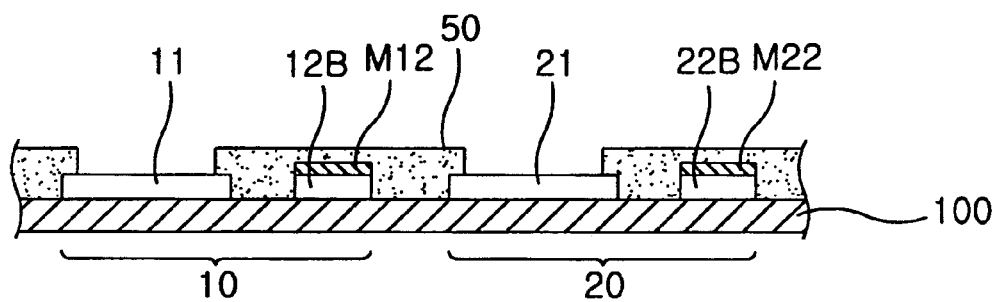
Figure 4D:
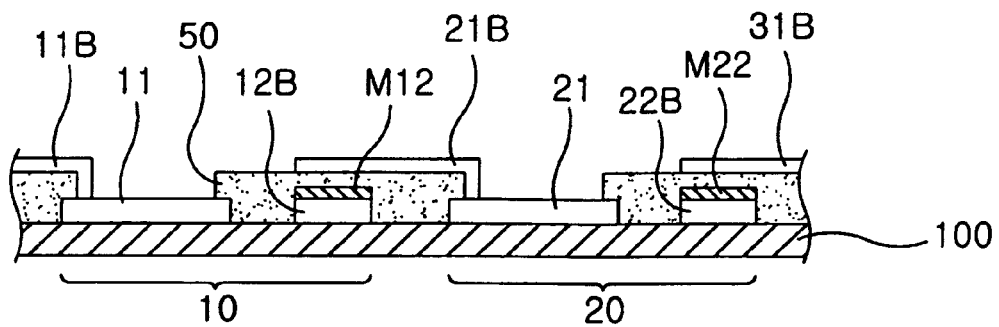

Then, an insulating layer 50 is formed on the first metal line M12, a part of the second ITO layer 21, and the substrate 100 between the first ITO layer 12 and the second ITO layer 21 (FIG. 4c).

Then, the second data line 21B is formed on the insulating layer 50 (FIG. 4d), and connected to the second ITO layer 21.

Figure 4E:
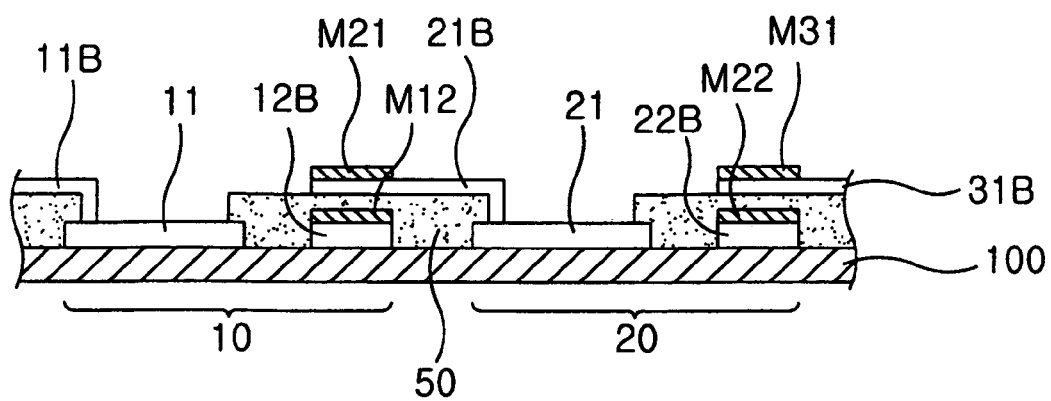

After the second data line 21B is formed, the second metal line M21 is formed on the second data line 21B (FIG. 4e). It is preferable to make the width of the second metal line M21 the same as that of the first metal line M12. The first metal line M12 and the second metal line M21 are connected to a pad part formed at the end of the substrate 100.

After the second metal line M21 is formed, an insulating layer 60 is formed on the above elements. The insulating layer 60 is not formed on the luminescent areas of each ITO layer which are illustrated as dotted lines in FIG. 3.

Figure 4F:
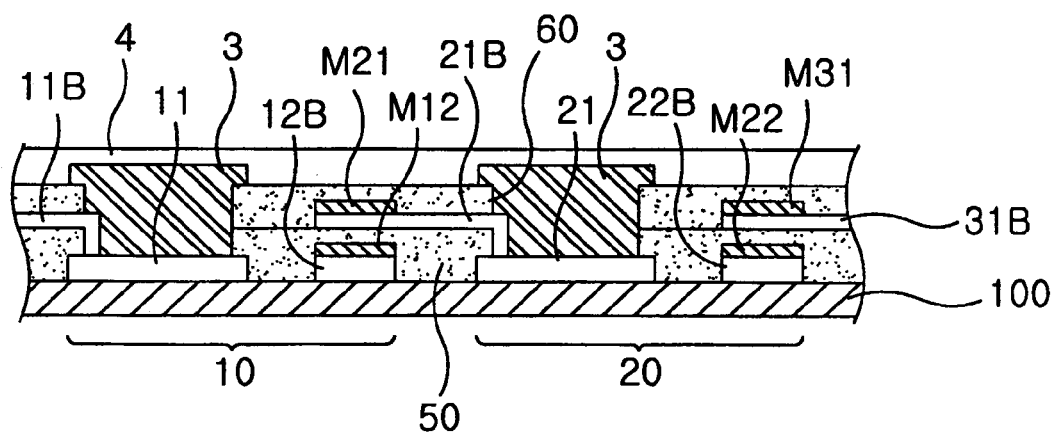

Walls to separate metal layers on the insulating layers are formed across the columns of ITO layer 10, 20, 30 and 40, as illustrated in FIG. 3. Then, organic layers 3 and metal layers (e.g. cathode electrode layers 4) are formed on the above elements in sequence, as illustrated in FIG. 4f, to complete the manufacturing method of the organic electroluminescent device according to the present invention.

From the preferred embodiment for the present invention, it is noted that modifications and variations can be made by a person skilled in the art in light of the above teachings. For example, although the anode electrode layer 2 has been illustrated as being on the substrate 100 with the cathode electrode layer being above, it would be possible to reverse this orientation such at the cathode layer is first applied to the substrate. Such an arrangement is intended to be covered by the overlying and underlying language used herein.

Also, although the invention has been described in a situation where one cathode electrode layer 4 underlies or overlies two anode electrode layers 2. Of course, three or more anode electrode layers 2 could overlap with one cathode electrode layer 4, such that three or more sets of data lines and metal lines would be present in the multi-layered structure of FIG. 4d. In such an instance, an additional data line (a mirror-image of the data line 21B in FIG. 4d) would be added to the multi-layered structure to electrically communicate with a third anode electrode layer 2 disposed on the left side of the multi-layered structure, as viewed in the perspective of FIG. 4d.

Therefore, it should be understood that changes may be made for a particular embodiment of the present invention within the scope and the spirit of the present invention outlined by the appended claims.

What is claimed is:

1. An organic electroluminescent device comprising:
   anode electrode layers;
   cathode electrode layers disposed to overlie or underlie the anode electrode layers;
   organic layers formed in parts where one cathode electrode layer overlies or underlies two anode electrode layers; and
   a multi-layered structure including two data lines, a first data line for supplying driving signals to a first anode electrode layer of said two anode electrode layers and a second data line for supplying driving signals to a second anode electrode layer of said two anode electrode layers,
   wherein said first and second data lines reside on different layers of said multi-layer structure.

2. The organic electroluminescent device of claim 1, wherein said first data line overlies or underlies said second data line in a cross section of said multi-layered structure.

3. The organic electroluminescent device of claim 1, wherein said first and second anode electrode layers reside adjacent to each other on said organic electroluminescent device.

4. The organic electroluminescent device of claim 3, further comprising: an insulating layer residing between said first and second anode electrode layers.

5. The organic electroluminescent device of claim 4, further comprising:
   a first metal line overlying said first data line, wherein said insulating layer overlies said first metal line.

6. The organic electroluminescent device of claim 5, wherein a width of said first data line is substantially the same as a width of said first metal line.

7. The organic electroluminescent device of claim 5, wherein said second data line overlies said insulating layer.

8. The organic electroluminescent device of claim 5, wherein said insulating layer also partially overlies said second anode electrode layer.

9. The organic electroluminescent device of claim 8, wherein said second data line overlies said insulating layer.

10. The organic electroluminescent device of claim 9, further comprising:
    a second metal line overlying said second data line.

11. The organic electroluminescent device of claim 10, wherein a width of said second metal line is substantially the same as a width of said first metal line.

12. An organic electroluminescent device comprising:
    anode electrode layers;
    cathode electrode layers disposed to overlie or underlie the anode electrode layers;
    organic layers formed in parts where a cathode electrode layer overlies or underlies at least two anode electrode layers; and
    a multi-layered structure including at least two data lines, a first data line for supplying driving signals to a first anode electrode layer of said at least two anode electrode layers and a second data line for supplying driving signals to a second anode electrode layer of said at least two anode electrode layers,
    wherein said first and second data lines reside on different layers of said multi-layered structure.

13. The organic electroluminescent device of claim 12, wherein said first and second anode electrode layers reside adjacent to each other on said organic electroluminescent device, and further comprising: an insulating layer residing between said first and second anode electrode layers.

14. The organic electroluminescent device of claim 13, further comprising: a first metal line overlying said first data line, wherein said insulating layer overlies said first metal line.

15. The organic electroluminescent device of claim 14, wherein said second data line overlies said insulating layer, and further comprising: a second metal line overlying said second data line.

16. The organic electroluminescent device of claim 15, wherein a width of said second metal line is substantially the same as a width of said first metal line.

* * * * *